United States Patent
Buchel et al.

(10) Patent No.: US 7,982,211 B2
(45) Date of Patent: Jul. 19, 2011

(54) ORGANIC BASED DEVICE AND METHOD FOR MANUFACTURE THEREOF

(75) Inventors: Michael Buchel, Eindhoven (NL); Adrianus Sempel, Eindhoven (NL); Ivar Jacco Boerefijn, Eindhoven (NL); Edward Willem Albert Young, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 749 days.

(21) Appl. No.: 11/993,478

(22) PCT Filed: Jun. 26, 2006

(86) PCT No.: PCT/IB2006/052095
§ 371 (c)(1),
(2), (4) Date: Dec. 21, 2007

(87) PCT Pub. No.: WO2007/004115
PCT Pub. Date: Jan. 11, 2007

(65) Prior Publication Data
US 2010/0163851 A1    Jul. 1, 2010

(30) Foreign Application Priority Data

Jun. 30, 2005   (EP) .................................... 05105859

(51) Int. Cl.
*H01L 35/24*   (2006.01)
*H01L 51/00*   (2006.01)
(52) U.S. Cl. ............................................. 257/40; 257/88
(58) Field of Classification Search .................... 257/40, 257/88–103, E39.007, E33.059
See application file for complete search history.

(56) References Cited

U.S. PATENT DOCUMENTS

| 7,759,670 | B2 * | 7/2010 | Liu et al. .......................... 257/13 |
| 2004/0031957 | A1 | 2/2004 | Tyan |
| 2004/0051446 | A1 | 3/2004 | Werner et al. |
| 2005/0093001 | A1 | 5/2005 | Liu et al. |
| 2010/0065829 | A1 * | 3/2010 | Forrest et al. .................... 257/40 |

FOREIGN PATENT DOCUMENTS

| EP | 0986112 A2 | 3/2000 |
| JP | 2004152699 A | 5/2004 |
| WO | 0225742 A2 | 3/2002 |
| WO | 2006104544 A1 | 10/2006 |

OTHER PUBLICATIONS

A. R. Duggal, et al: A Fault-Tolerant, Scalable Organic Light-Emitting Device Architecture, Dec. 2003, Imaging Technologies, GE Global Research, 2003GRC267.

* cited by examiner

*Primary Examiner* — Cuong Q Nguyen
(74) *Attorney, Agent, or Firm* — Mark L. Beloborodov

(57) ABSTRACT

A device comprising a first transparent and electrically conductive layer (102), a second electrically conductive layer (104), and a functional layer (103) comprising at least one organic layer, sandwiched between said first and second conductive layers and to form a functional organic stack. At least one via (110) is arranged to electrically interconnect said first layer (102) and at least one segment (112) of said second layer (104), the segment being electrically insulated from the reminder of the second layer. The present invention makes it possible to uniformly supply the first transparent layer with electrical power. The vias and segments are preferably formed by laser applied through the transparent conductive layer.

6 Claims, 2 Drawing Sheets

ORGANIC BASED DEVICE AND METHOD FOR MANUFACTURE THEREOF

The present invention relates to a device comprising a functional layer comprising at least one organic layer sandwiched between a first transparent and electrically conductive layer and a second electrically conductive layer.

In such a device, the functional layer interacts with the voltage between the conductive layers. In some cases the voltage is created by the functional layer, e.g. organic solar cells, organic photovoltaic elements, organic photo-sensors. In other cases, a voltage is applied to drive the functional layer, e.g. organic photodiodes, organic light emitting diodes (OLEDs). Such organic based devices are generally touted for their performance and low power consumption. For example, OLEDs are known for having wide viewing angle and rapid image response.

While being commercially successful in small area applications, such as cell phones displays, large area organic devices have met technical difficulties. Since the anode and cathode layers are thin-films having limited electrical conductivity, they are not able to carry high currents without substantial energy loss. This problem is further accentuated when one of the electrode layers also has to be optically transparent to allow light to pass through.

In order to solve this problem, metal shunts can be introduced, having as consequence that the effective light transmitting surface is reduced.

US 2004/0031957 discloses a large area organic light emitting device. This document describes using a stacked structure to reduce power consumption due to series resistance. However, the problem still persists for non-stacked large area OLED devices. Therefore a cheap method is desired that deals with the problem of electrical energy loss and uniform current distribution to the entire surface of the transparent electrode layer.

The above need is met by a device and a method as defined in independent claims 1 and 8. The dependent claims define advantageous embodiments in accordance with the present invention.

According to a first aspect thereof, the present invention provides a device comprising a first transparent and electrically conductive layer, a second electrically conductive layer, and a functional layer comprising at least one organic layer sandwiched between the first and second conductive layers to form an organic functional stack. The device further comprises at least one via arranged to electrically interconnect the first transparent layer and at least one segment of the second layer, the segment being electrically insulated from the remainder of the second layer and arranged as a shunt for providing electrical power to the first electrically conducting layer, thereby allowing for uniform distribution of electrical power to the first electrically conducting layer.

The functional layer may consist of many different organic layers with different functions (like for hole injection, hole transport, hole blocking, exciton blocking, electron blocking, electron transport, electron injection or light emitting, light absorbing layers), or mixtures thereof, but may also include metal-organic materials like triplet emitters or inorganic materials like dielectric, semi-conducting or metallic quantum dots or nano-particles.

This first aspect of the present invention makes it possible to uniformly supply the first transparent layer with electrical power. The interconnection between the first and the second layer is preferably done using more than one via.

According to a preferred embodiment of the invention, pluralities of electrically insulated segments of the second layer are electrically interconnected to each other. In case of e.g. a light emitting device this solution allows for simple power supply to each of the insulated segments, thereby uniformly supplying the first transparent layer with electrical power. In case of e.g. a solar cell this solution allows for simple current collection.

Such an interconnection can be provided by a third layer arranged on top of, i.e. next to, said second layer, wherein said third layer is electrically conducting and insulated from said second layer and electrically interconnected to the plurality of electrically insulated segments of the second layer, thereby providing electrical interconnection between said segments. Again, this allows for simplified power supply or simplified current collection.

One segment can be connected to the first layer by a plurality of vias. This allows for easy connection to a number of vias by connecting only one segment, compared to a situation where each via is connected to a separate segment. This is especially advantageous in a case where the segments are connected directly to a drive voltage.

In the case of one segment being connected to a plurality of vias, the segment can have a geometrical form so as to minimize the effect on light transmitting surface of the device. As an example, the segment could have a meander structure. A meander structure would divide the second layer in two parts so that only two islands of "finger-electrode" shape would arises that make interconnection very easy. The effective light emitting surface becomes smaller because one finger-electrode serves only to deliver the current with help of vias to the first transparent and electrically conductive layer.

The vias and segments are preferably formed by laser applied through the transparent conductive layer.

The vias can be formed by temporally local heating of the entire stack consisting of both conductive electrode layers and the functional layer comprising at least one organic layer in between. This can be achieved by applying a continuous wave laser through the transparent conductive layer, thereby generating temporally continuous heat which leads to an isolated pyrolysis of the organic layers, finally leading to a graphite like conductor plus a mixing with any molten metal from the electrodes.

Preferably, the first transparent conductive layer is provided on a transparent substrate, and the laser can then be applied through the substrate.

The device according to the invention can advantageously be used as a light emitting device, wherein the functional layer is an organic light emitting layer. Such a light emitting device can present a homogenous light output even over a large area.

The device according to the invention may also be used in e.g. organic solar cells, organic photovoltaic elements, organic photodiodes, organic photo-sensors or organic memories.

A further aspect of the present invention provides a method for manufacturing an organic device. The method comprises the steps of providing a first transparent and electrically conductive layer and a second conductive layer, sandwiching a functional layer comprising at least one organic layer between said first and second electrically conductive layers, electrically insulating at least one segment of said second layer from the remainder of the second layer, and forming at least one via to electrically interconnect said first layer and said at least one segment, wherein said at least one segment is arranged as a shunt for providing electrical power to the first electrically conducting layer, thereby allowing for uniform distribution of electrical power to the first electrically conducting layer. The step of forming the at least one via preferably comprises temporally local heating of the stack comprising both electrodes and the functional layer.

This method allows for manufacturing of a device where uniformly supply of electrical power or collection of current is possible.

The step of temporally locally heating the stack layer can be performed using a continuous wave laser, applied through the transparent conductive layer. The step of electrically insulating the segments is preferably performed by removing portions of the second layer by means of a pulsed laser, applied through the transparent conductive layer.

The transparent conductive layer can be provided on a transparent substrate, in which case any laser can be applied through the substrate. It has been found that laser application through the substrate is surprisingly effective, and does little or no damage to surrounding layers.

Further features of, and advantages with, the present invention will become apparent when studying the appended claims and the following description. Those skilled in the art realize that different features of the present invention can be combined to create embodiments other than those described in the following.

The present invention will now be described in more detail with reference to the accompanying drawings, in which FIG. 1 illustrates a schematic side view of a device according to an embodiment of the invention.

In the following description, the present invention is described with reference to a light emitting panel. It should be noted that this by no means limits the scope of the invention, which is equally applicable to many organic functional stacks with similar structure, used for example as organic solar cells or organic photodiodes.

Figure 1:
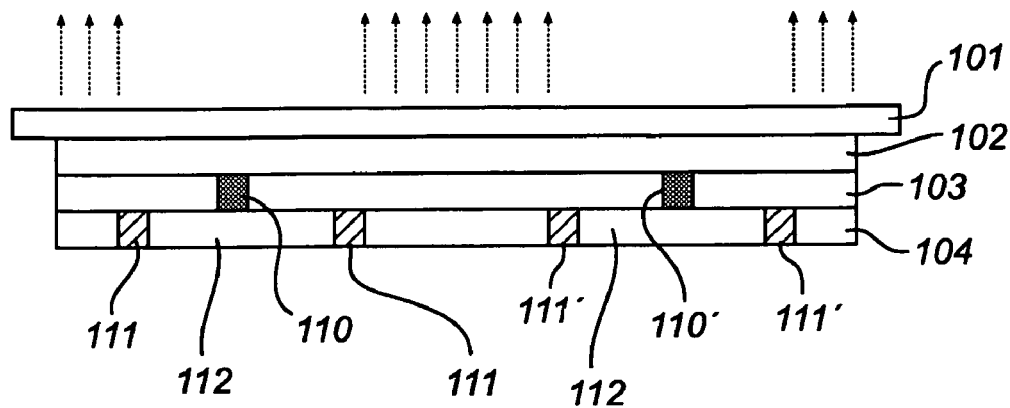

FIG. 1 illustrates a schematic side view of an organic lighting emitting element according to an embodiment of the invention. In this example, a first substrate 101, preferably of glass, plastic or the like, is arranged as a protective layer for the organic lighting emitting panel. Below this layer is a first transparent and electrically conductive layer 102 arranged. This first layer is preferably one of Indium Tin oxide (ITO) or Zinc oxide (ZnO) or the like or from a very thin metal layer. Sandwiched between this first layer 102 and a second electrically conductive layer 104 is a functional layer 103, here a light emitting layer, comprising at least one organic layer. The functional layer and the conductive layers (electrodes) are generally referred to as a functional organic stack.

The light emitting layer 103 can consist in general of many organic layers. In the case of a polymer LED it is mostly a two layer stack: hole conductor/light emitting polymer but can include much more layers like for example an evaporated organic hole blocking layer on the light emitting polymer. In the case of a small molecule OLED it is a more complex stack like for example: hole injection layer, hole transport layer, emitting layer, hole blocking layer, electron transporting layer, but can include much more layers for example three different emitting layer to generate emission of white light. The second electrically conductive layer 104 is preferably one of Barium (Ba) or Calcium (Ca), Aluminum (Al), Silver (Ag), Zinc Selenide ZnSe) or the like or stacks of them and may additionally contain an injection layer like Lithium Fluoride (LiF) or the like.

When a potential difference is applied between the electrically conductive layers (anode and the cathode), negatively charged electrons move from the cathode layer into the OLED device. At the same time, positive charges, typically referred to as holes, move from the anode layer into the OLED device. When the positive and negative charges meet, they recombine and produce photons. The wavelength, and consequently the color, of the photons depend on the electronic properties of the organic material in which the photons are generated. In an OLED device either the cathode layer or the anode layer or both are transparent to the photons generated, allowing the light to emit from the device to the outside world. In the embodiment shown in FIG. 1, the first conductive layer 102 is transparent, and light will be emitted from the organic lighting emitting panel in the directions of the arrows.

Furthermore, FIG. 1 shows two vias 110 and 110', connecting the first conducting layer with at least one segment 112 of the second layer. Each segment 112 is insulated from the remainder of the second layer 104 by voids 111, from which portions have been removed from the second layer. The vias thereby provide a way to electrically connect the segment(s) to the first conducting layer, in order to achieve a uniform current distribution. Preferably, the remainder of the layer 104 forms a connected layer surrounding all the segments 112.

According to a preferred embodiment, the vias 110, 110' have been formed through local heating by a continuous wave laser that is focused with a microscope objective to a small spot size, for example a spot size of ca. 10 μm. Preferably, the laser is applied through the substrate 101. The heating of the stack creates local pyrolysis of the emitting layer 103 resulting in a graphite like material and local melting of the second layer. The layers mix to form conducting phase, which forms the vias, 110 and 110'.

A via 110 can be formed by a single stationary laser shot, thus having a point-like extension, or be formed by several neighboring laser shots. Alternatively, a locally extended via can be formed by moving the continuous wave laser along a line.

Further, according to a preferred embodiment, the voids 111 in the second layer 104 are formed by removing portions of material around the vias 110 and 110' using a pulsed laser or other structuring methods such as shadow masking during deposition. Again, the laser is preferably applied through the substrate.

Figure 2:
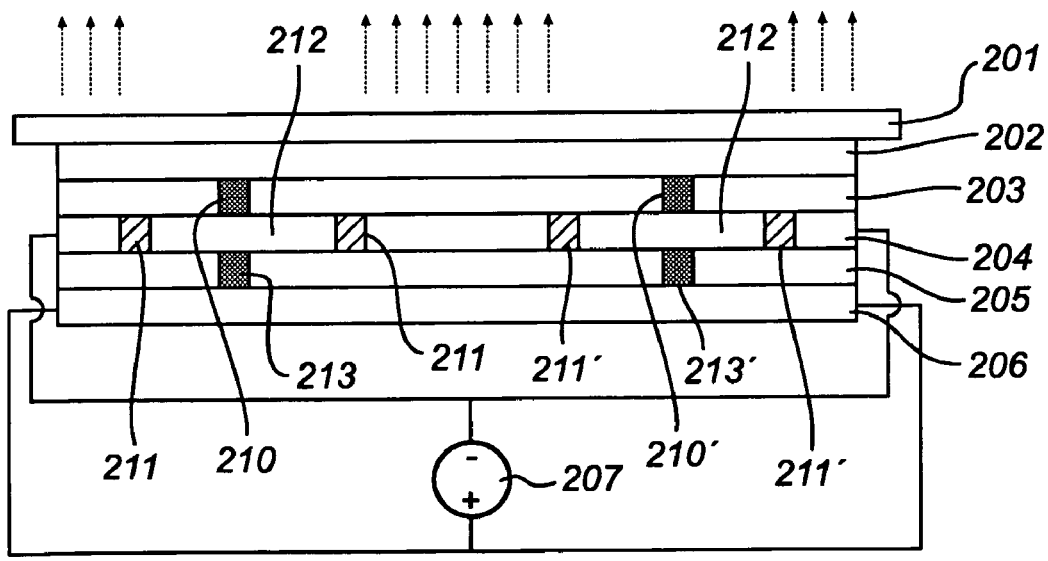
FIG. 2 illustrates a schematic side view of a device according to an alternative embodiment of the invention.

FIG. 2 illustrates a schematic side view of an organic lighting emitting panel according to an alternative embodiment of the invention. As in FIG. 1, a first substrate 201 is arranged as a protective layer for the organic lighting emitting panel. In the same way, vias 210 and 210' interconnect the first transparent and electrically conductive layer 202 and insulated segments 212 of the second electrically conductive layer 204 through the emission layer 203. The vias 210 and segments 212 can be created as described above with reference to FIG. 1.

In the embodiment in FIG. 2, the segments are interconnected with a third electrically conductive layer 206, which is insulated against the second layer 204 by an insulating layer 205. The layer 206 is connected to the segments 212 by contacts 213, to thereby provide interconnection of all segments 212.

The insulating layer 205 (composed of organic insulators like photo-resist or inorganic like SiO2, silicone nitride or a multiplayer of both) can be deposited on the whole surface of the second layer, 204, where after the third conductive (e.g. metal) layer 206 is deposited on the insulating layer 205. By local heating of the extra layer 206 above the electrically insulated segment, the contact 213 can be created between the extra layer 206 and the electrically insulated segment. This method to make contacts is well proven for Si-solar cells for a semiconductor/dielectrics/metal stack. WO 02/25742 teaches such a method for making back contacts in solar cells.

Alternatively, the conducting layer 206 and the insulating layer 205 are two sides of a foil, deposited on the second layer 204. By local heating, as described above, the contact 213 can again be made between the conductor side 206 and the electrically insulated segment.

FIG. 2 further shows an exemplified electrical connection to an organic lighting emitting panel according to an embodiment of the present invention. In this example, the first layer 202 serves as the anode, whereas the second layer 204 serves as the cathode. A power supply 207 feeds the third layer 206 with electrical current, which is connected through vias with 202.

Figure 3:
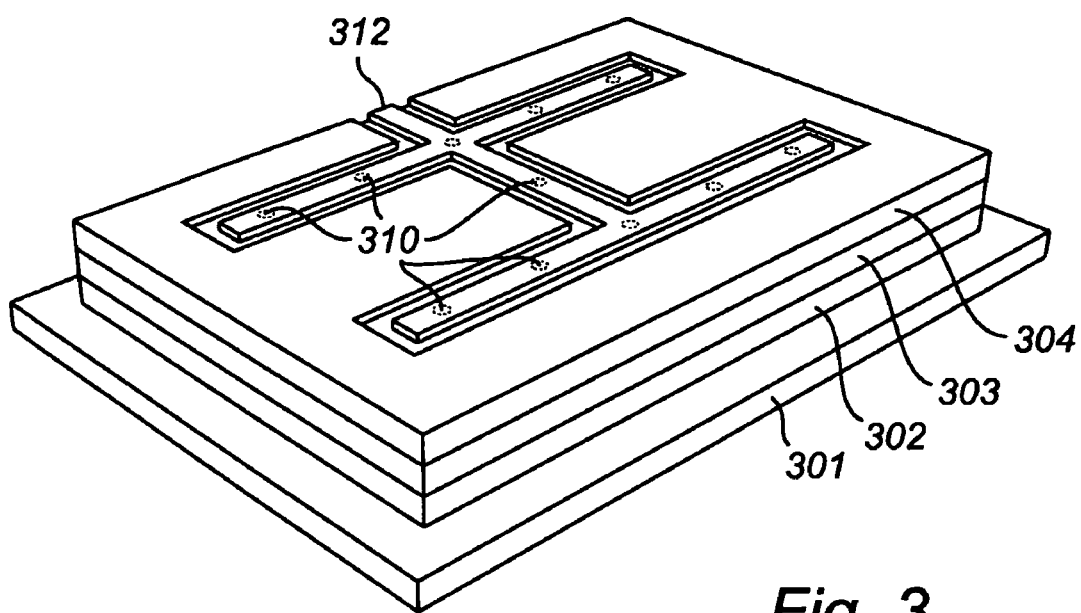
FIG. 3 illustrates a schematic perspective view of a device according to yet another alternative embodiment of the invention.

FIG. 3 illustrates a schematic perspective view of an organic lighting emitting panel according to another alternative embodiment of the invention. In this example the first transparent and electrically conductive layer 302 serves as anode, and the second electrically conductive layer 304 as cathode. Further, in this example the electrically insulated segment 312 of the second layer 304 is arranged as a meander structure. This electrically insulated segment 312 makes contact with the first transparent and electrically conductive layer 302 through the vias 310, and serves as an anode shunt, whereby uniform distribution of electrical power to the layer is possible. Since the anode shunt finger-electrode cannot emit light, it should be designed as small as possible. FIG. 3 further shows an emission layer 303 and a substrate 301.

Even though the invention has been described with reference to specific exemplifying embodiments thereof, many different alterations, modifications and the like will become apparent for those skilled in the art. The described embodiments are therefore not intended to limit the scope of the invention, as defined by the appended claims. For example, the meander shape shown in FIG. 3 can have any geometrical shape suitable for the purpose of interconnecting the vias. Furthermore, the materials used for any of the layers can be suitably selected depending of the purpose and use of the organic stack, e.g. use as a lighting emitting diodes, organic solar cells or photodiodes. Further, although in the above description, the conductive layer that is provided on a substrate is transparent, this is not necessary. It is also possible that the conductive layer provided on the opposite side (not in contact with the substrate) is transparent. In that case, the laser is preferably applied from that side. Finally, both conductive layers may be transparent, in which case the laser can be applied from both sides.

The invention claimed is:

1. A device comprising a first transparent and electrically conductive layer, a second electrically conductive layer, and a functional layer comprising at least one organic layer, sandwiched between said first and second conductive layer to form an organic functional stack, characterized by at least one via arranged to electrically interconnect said first transparent layer and at least one segment of said second layer, said segment being electrically insulated from the reminder of the second layer and arranged as a shunt for providing electrical power to the first electrically conducting layer, thereby allowing for uniform distribution of electrical power to the first electrically conducting layer, wherein a plurality of said segments are electrically interconnected to each other.

2. A device according to claim 1, wherein at least one electrically insulated segment is electrically interconnected to said first layer by more than one via.

3. A device according to claim 1, further comprising a third conducting layer arranged next to said second layer, said third layer being insulated from said second layer and electrically interconnected to said plurality of segments, thereby providing electrical interconnection between said segments.

4. A device according to claim 1, wherein said at least one via is formed by temporally locally heating the stack comprising both electrodes and the functional layer, thereby forming a graphite like conductor.

5. A device according to claim 1, wherein said functional layer is an organic light emitting layer adapted to convert current to light, or an organic light absorbing layer adapted to convert light to current.

6. A device according to claim 1, wherein said first, transparent conductive layer is provided on a transparent substrate.

* * * * *